United States Patent
Kim

(10) Patent No.: US 10,177,677 B2
(45) Date of Patent: Jan. 8, 2019

(54) INVERTER STRUCTURE FOR VEHICLE

(71) Applicants: HYUNDAI MOTOR COMPANY, Seoul (KR); KIA MOTORS CORPORATION, Seoul (KR)

(72) Inventor: Yun Ho Kim, Seoul (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 0 days.

(21) Appl. No.: 15/613,833

(22) Filed: Jun. 5, 2017

(65) Prior Publication Data
US 2018/0145603 A1 May 24, 2018

(30) Foreign Application Priority Data

Nov. 24, 2016 (KR) .................. 10-2016-0157086

(51) Int. Cl.
*H02M 7/00* (2006.01)
*H02K 7/20* (2006.01)
(Continued)

(52) U.S. Cl.
CPC ............ *H02M 7/003* (2013.01); *H02K 5/225* (2013.01); *H02K 11/33* (2016.01);
(Continued)

(58) Field of Classification Search
CPC . H02M 7/003; H05K 7/1432; H05K 7/20927; H05K 7/209; H05K 7/2089; H05K 7/2039; H05K 7/20845; H02K 11/33; H02K 5/225; H02K 9/22; B60L 15/007; B60L 11/14; B60L 2210/40; B60L 11/1803;
(Continued)

(56) References Cited

U.S. PATENT DOCUMENTS

2006/0284308 A1* 12/2006 Harada .................. H01L 25/072
257/729
2008/0136265 A1* 6/2008 Mizukoshi ............ H02M 7/003
307/89

(Continued)

FOREIGN PATENT DOCUMENTS

KR  10-2012-0017545 A  2/2012
KR  10-2014-0078175 A  6/2014

OTHER PUBLICATIONS

Extended European Search Report dated Dec. 7, 2017, in corresponding European patent application 17176574.6.

*Primary Examiner* — Adam B Dravininkas
(74) *Attorney, Agent, or Firm* — Brinks Gilson & Lione

(57) ABSTRACT

An inverter structure for a vehicle is provided. The inverter includes a capacitor for receiving direct current supplied from a battery, a power module assembly including a plurality of power modules and a plurality of coolers, and an output bus-bar connected to the plurality of power modules to output three-phase alternating current to a motor. In particular, inside of the power module, power modules of a plurality of power modules are connected to the capacitor to convert the direct current into the three-phase alternating current, and coolers of a plurality of coolers are alternately stacked one above another such that each cooler comes into contact at its upper and lower surfaces with adjacent power modules to enable heat transfer.

8 Claims, 7 Drawing Sheets

(51) Int. Cl.
*H05K 7/20* (2006.01)
*H02K 11/33* (2016.01)
*H02K 5/22* (2006.01)

(52) U.S. Cl.
CPC ..... *H05K 7/20845* (2013.01); *H05K 7/20927* (2013.01); *B60Y 2200/92* (2013.01); *B60Y 2306/05* (2013.01); *B60Y 2400/604* (2013.01)

(58) Field of Classification Search
CPC ............... B60L 3/003; B60L 2240/36; B60L 2240/525; B60L 2240/545; B60L 2210/30; B60Y 2306/05; B60Y 2200/92; B60Y 2400/604
See application file for complete search history.

(56) References Cited

U.S. PATENT DOCUMENTS

| | | | | |
|---|---|---|---|---|
| 2011/0249421 | A1* | 10/2011 | Matsuo | B60K 6/445 |
| | | | | 361/821 |
| 2011/0261600 | A1* | 10/2011 | Tachibana | H02M 7/003 |
| | | | | 363/131 |
| 2014/0092663 | A1* | 4/2014 | Shimizu | H02M 7/003 |
| | | | | 363/141 |
| 2015/0195957 | A1* | 7/2015 | Ohoka | H05K 7/1432 |
| | | | | 361/702 |
| 2016/0308480 | A1* | 10/2016 | Wang | B60L 11/1803 |
| 2016/0308481 | A1 | 10/2016 | Lei et al. | |
| 2017/0003323 | A1* | 1/2017 | Nakayama | G01R 15/148 |
| 2017/0054347 | A1* | 2/2017 | Lei | H01L 25/07 |

* cited by examiner

INVERTER STRUCTURE FOR VEHICLE

CROSS-REFERENCE TO RELATED APPLICATION

This application claims the priority to and the benefit of Korean Patent Application No. 10-2016-0157086, filed on Nov. 24, 2016, which is incorporated herein by reference in its entirety.

FIELD

The present disclosure relates to an inverter structure for a vehicle.

BACKGROUND

The statements in this section merely provide background information related to the present disclosure and may not constitute prior art.

An environmentally friendly vehicle, which uses an electric motor as a drive source, such as, for example, a hybrid vehicle or an electric vehicle, generally uses, for example, a high-voltage battery as an energy source for driving the electric motor, and also uses power conversion parts, i.e. an inverter for providing a voltage to the motor and a low DC-DC converter (LDC) for realizing a vehicle voltage of 12 V.

Here, the inverter is provided between the electric motor and the high-voltage battery to convert the DC voltage of the high-voltage battery into a three-phase AC voltage and provide the same to the motor.

The main purpose of conventional electric vehicles is short-distance driving and city driving, and thus they usually feature relatively low output models of about 100 kW. That is, the power source of such an electric vehicle is generally a single motor for the front wheels because the electric vehicle does not need a high output, and thus the inverter for supplying current to the motor is also provided to correspond to an output within a relatively small range.

However, a variety of electric vehicles including, for example, sports-car-type and SUV-type electric vehicles, have recently been developed, and thus output specifications desired for the electric vehicles have diversified. It is impossible to satisfy an increased number of output specifications using only a single motor because of limitations on the size and weight of the motor, and thus an electric vehicle model in which a plurality of motors is provided for the front wheels and the rear wheels is being developed. Therefore, specifications of the inverter, which supplies current to the motor, have diversified. For example, when a 200 kW motor is provided on the front wheels and a 300 kW motor is provided on the rear wheels, the same inverter has difficulty in handling the two motors at the same time.

Meanwhile, the inverter, which has a planar structure, is configured such that a power module, a capacitor, and an LDC are disposed on the bottom surface of a housing, and a control board is disposed on the upper end thereof. A cooling path, along which cooling water flows, is formed below the power module and the LDC, which generate a large amount of heat, in order to inhibit or prevent, for example, deterioration in performance or damage to elements due to excessive heat.

A general inverter converts current using a single power module, and needs to use a high-output power module or to have an increased number of power modules in order to have increased output. It is difficult to realize high output of a predetermined value due to the properties of a switching element constituting the power module, and thus most inverters adopt the parallel connection of a plurality of power modules in order to deal with high-output specifications. However, because the housing and the cooling path need to be changed when the number of power modules is increased, the existing inverter concept may not be maintained and it is desired to develop a new inverter.

Accordingly, the expense and time taken to develop inverters that meet respective output specifications may be increased, and there is demand for a commonly usable structure capable of varying the output of an inverter.

The matters disclosed in this section is merely for enhancement of understanding of the general background of the present disclosure and should not be taken as an acknowledgment or any form of suggestion that the matters form the related art already known to a person skilled in the art.

SUMMARY

The present disclosure provides an inverter structure for a vehicle, which may deal with various motor outputs while having a consistent shape because the shape of a cooling path does not need to be changed even when the number of power modules to be applied is changed.

In one aspect of the present disclosure, an inverter structure is provided for a vehicle including a capacitor configured to receive direct current (DC) supplied from a battery, a power module assembly in which power modules of a plurality of power modules are connected to the capacitor to convert the direct current into three-phase alternating current (AC), and coolers of a plurality of coolers are alternately stacked one above another such that each cooler of the plurality of coolers comes into contact at upper and lower surfaces thereof with adjacent power modules of the plurality of power modules for heat transfer therebetween, and an output bus-bar connected to the plurality of power modules configured to output the three-phase alternating current to a motor.

The power module assembly may be configured such that the power modules of the plurality of power modules are divided into three columns and are stacked one above another and the coolers of the plurality of coolers are stacked one above another in a column so as to come into contact with the power modules of the plurality of power modules in a horizontal direction.

The capacitor may include three pairs of P and N terminals, and each pair of the P and N terminals may be connected to the power modules of the plurality of power modules, which are stacked one above another in one column among the three columns of the plurality of power modules, via a DC bus-bar.

The output bus-bar may be connected, on an individual phase basis, to at least one power module of the plurality of power modules, which are stacked one above another in one column among the three columns of the plurality of power modules, via an AC bus-bar and a current sensor.

The AC bus-bar may connect two power modules of the plurality of power modules to one end of the current sensor, and the current sensor may include a remaining end connected to the output bus-bar. The plurality of power modules may be provided on one side thereof with a plurality of pins, which is connected to a circuit board, and the pins of the plurality of pins may be fixed by a bracket.

The power module assembly may further include an upper surface plate configured to come into contact with an upper surface of an uppermost one of the stacked coolers, a lower surface plate configured to come into contact with a lower surface of a lowermost one of the stacked coolers, and a fixing piece configured to fix the upper surface plate and the lower surface plate to each other.

The lower surface plate may be provided with a leaf spring configured to apply force upward at a position corresponding to each of the three columns of the plurality of power modules.

The power module assembly may be provided in one side of a housing, the capacitor may be provided in a lower region of an opposite side of the housing, and the output bus-bar may have one end provided in an upper region of the opposite side of the housing and a remaining end protruding outward from the housing.

Further areas of applicability will become apparent from the description provided herein. It should be understood that the description and specific examples are intended for purposes of illustration only and are not intended to limit the scope of the present disclosure.

DRAWINGS

The above and other objects, features and other advantages of the present disclosure will be more clearly understood from the following detailed description taken in conjunction with the accompanying drawings.

In order that the disclosure may be well understood, there will now be described various forms thereof, given by way of example, reference being made to the accompanying drawings, in which.

Figure 1:
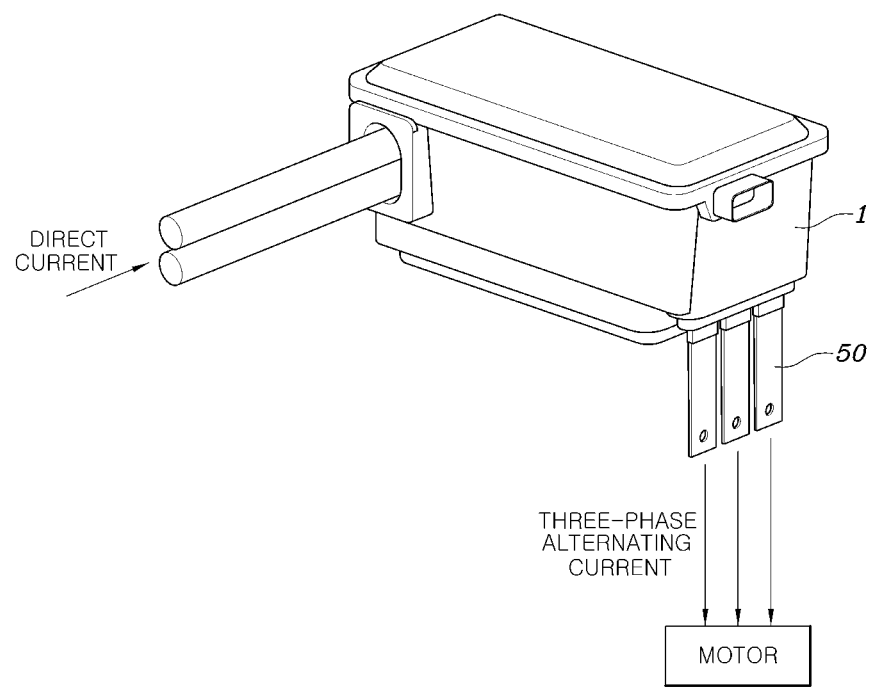
FIG. 1 is a perspective view illustrating the external appearance of an inverter.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 is a perspective view illustrating the external appearance of an inverter in one form of the present disclosure. As illustrated in FIG. 1, the inverter is configured to transmit direct current (DC) received from a high voltage battery (not illustrated) to a capacitor provided inside a housing 1, to convert the direct current into three-phase alternating current via a power module connected to the capacitor, and to transmit the alternating current to a motor via an output bus-bar 50.

Figure 2:
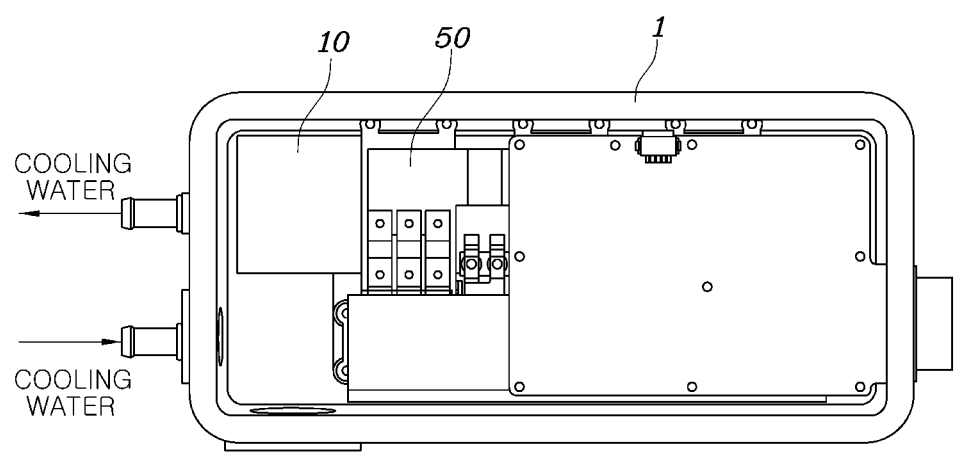
FIG. 2 is a top cross-sectional view of the inverter.

FIG. 2 is a top cross-sectional view of the inverter in one form of the present disclosure. Referring to FIG. 2, the housing 1 is provided with an inlet and an outlet, which are formed in the lower portion of the side surface of the housing 1. Through the inlet and the outlet, the region below a capacitor 10 is subjected to cooling, and cooling water is supplied to a cooler so as to perform the cooling of a power module.

Figure 3:
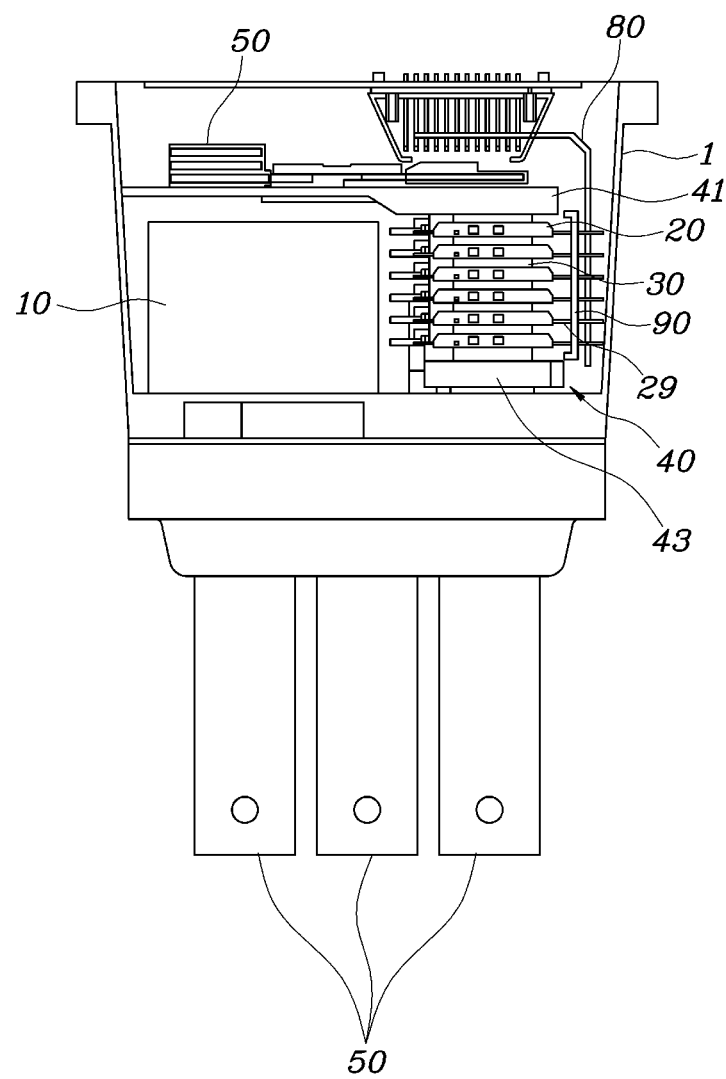
FIG. 3 is a side cross-sectional view illustrating an inverter structure for a vehicle.
Figure 4:
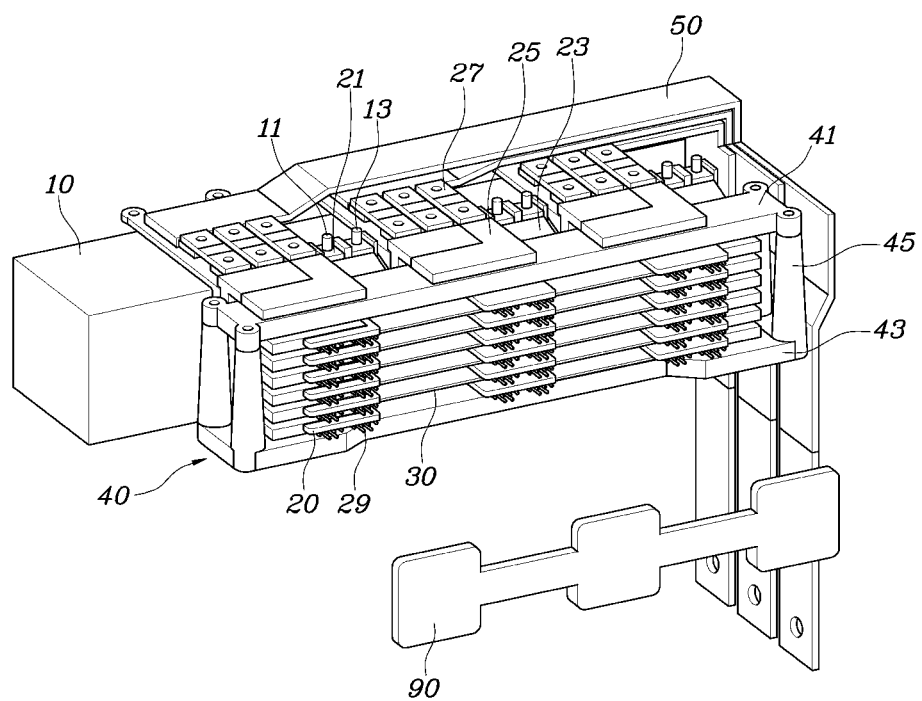
FIG. 4 is a perspective view illustrating the inverter structure for the vehicle.

FIG. 3 is a side cross-sectional view illustrating an inverter structure for a vehicle in one form of the present disclosure, and FIG. 4 is a perspective view illustrating the inverter structure for the vehicle in one form of the present disclosure. Referring to FIGS. 3 and 4, the inverter structure for the vehicle may include the capacitor 10 for receiving direct current supplied from a battery, a power module assembly 40 in which power modules of a plurality of power modules 20 are connected to the capacitor 10 to convert the direct current into three-phase alternating current, and in which coolers of a plurality of coolers 30 are alternately stacked one above another such that each cooler comes into contact at upper and lower surfaces thereof with the power modules 20 to enable heat transfer therebetween, and the output bus-bar 50 connected to the power modules 20 to output the three-phase alternating current to a motor.

That is, because the power modules 20 and the coolers 30 are alternately stacked one above another, the power module assembly 40 may perform effective cooling even when the plural power modules 20 are arranged in parallel with one another, and may reduce the volume of an inverter.

Here, the inverter structure has features by which the power module assembly 40 is provided in one side of the housing 1, the capacitor 10 is provided in the lower region of the opposite side of the housing 1, and the output bus-bar 50 has one end provided in the upper region of the opposite side of the housing 1 and the other end protruding outward from the housing 1. With this structure, the inverter may have a compact internal configuration, and thus the volume of the inverter may be reduced.

In the present technology, the power module assembly 40 may be configured such that the power modules 20 are stacked one above another in three columns and the coolers 30 are stacked one above another in a column to come into contact with the power modules 20 in the horizontal direction.

That is, the power modules 20 are provided in three columns, and the power modules 20 of each column respectively convert direct current supplied from the capacitor 10 into alternating current including U, V and W phases, thereby outputting three-phase alternating current.

In addition, because the coolers 30 are stacked one above another in a column, unlike the power modules 20, which are stacked in three columns, the coolers 30 may realize cooling of the power modules 20 with a minimum number of elements. To this end, the power modules 20 may be arranged side by side in the horizontal direction.

To assist understanding, for example, as illustrated in FIGS. 3 and 4, the power module assembly 40 may include a total of eighteen power modules 20, which are arranged in six rows and three columns, and seven coolers 70 may be provided to come into contact with the upper and lower surfaces of the power modules 20.

Figure 5:
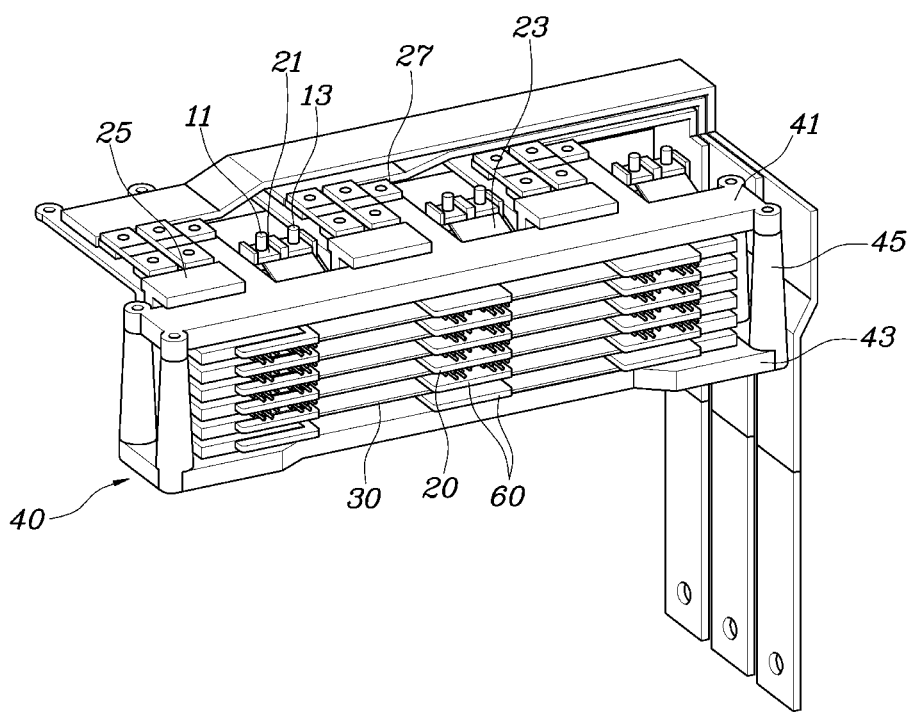
FIG. 5 is a perspective view illustrating an inverter structure in which the number of power modules is reduced.

Meanwhile, FIG. 5 is a perspective view illustrating an inverter structure in which the number of power modules is reduced in one form of the present disclosure. Assuming that a motor output corresponding to the case where the power modules 20 are arranged in six rows and three columns is approximately 300 kW, as illustrated in FIG. 5, an inverter may be configured to correspond to the motor output of approximately 200 kW under the assumption that the power modules 20 are arranged in four rows and three columns. At this time, an insulation material dummy 60 is mounted at the position at which the existing power module 20 is present, in order to maintain the surface pressure of the power module assembly 40.

Accordingly, the inverter of the present disclosure may be provided in a manner able to correspond to various motor outputs by changing the number of power modules without changing the configuration of the coolers. Thus, the merchantability of the inverter may be improved in terms of the common use of parts and the price.

More specifically, in the present disclosure, the capacitor 10 may include three pairs of P and N terminals 11 and 13, and each pair of P and N terminals 11 and 13 may be connected to the power modules, which are stacked one above another in one column among the three columns of the power modules 20, via DC bus-bars 21 and 23.

Figure 6:
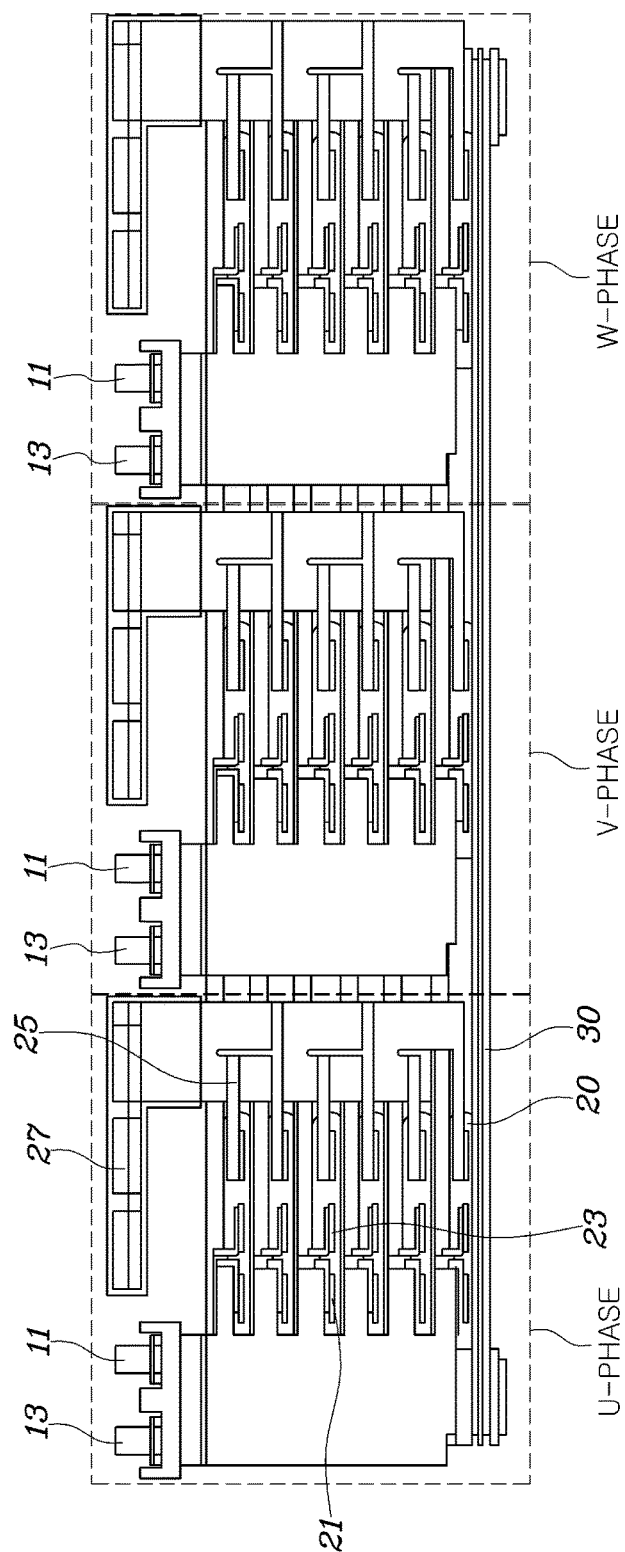
FIG. 6 is a cross-sectional view illustrating the connection relationship of a power module assembly.

FIG. 6 is a cross-sectional view illustrating the connection relationship of the power module assembly in one form of the present disclosure. Referring to FIGS. 4 and 6, when the power modules 20 are provided in six rows and three columns, the DC bus-bars 21 and 23 are respectively fitted at one end thereof to a pair of the P terminal 11 and the N terminal 13 formed on the capacitor 10, and the other end is diverged into six portions to thereby be connected to the respective power modules 20 provided in one column. At this time, the DC bus-bar 21 connected to the P terminal 11 is connected to a positive (+) terminal of the power module and the DC bus-bar 23 connected to the N terminal 13 is connected to a negative (−) terminal of the power module, so as to supply direct current to the power module.

In addition, in forms of the present disclosure, the output bus-bar 50 may be connected, on an individual phase basis, to the power modules 20, which are stacked one above another in one column among the three columns of the power modules 20, via an AC bus-bar 25 and a current sensor 27.

Here, the current sensor 27 measures the value of the three-phase alternating current output from the power modules 20. A control board (not illustrated) is provided to perform variable control of the performance of the power modules 20 based on the measured three-phase alternating current.

Here, the AC bus-bar 25 may connect two power modules 20 to one end of the current sensor 27, and the other end of the current sensor 27 may be connected to the output bus-bar 50.

Figure 7:
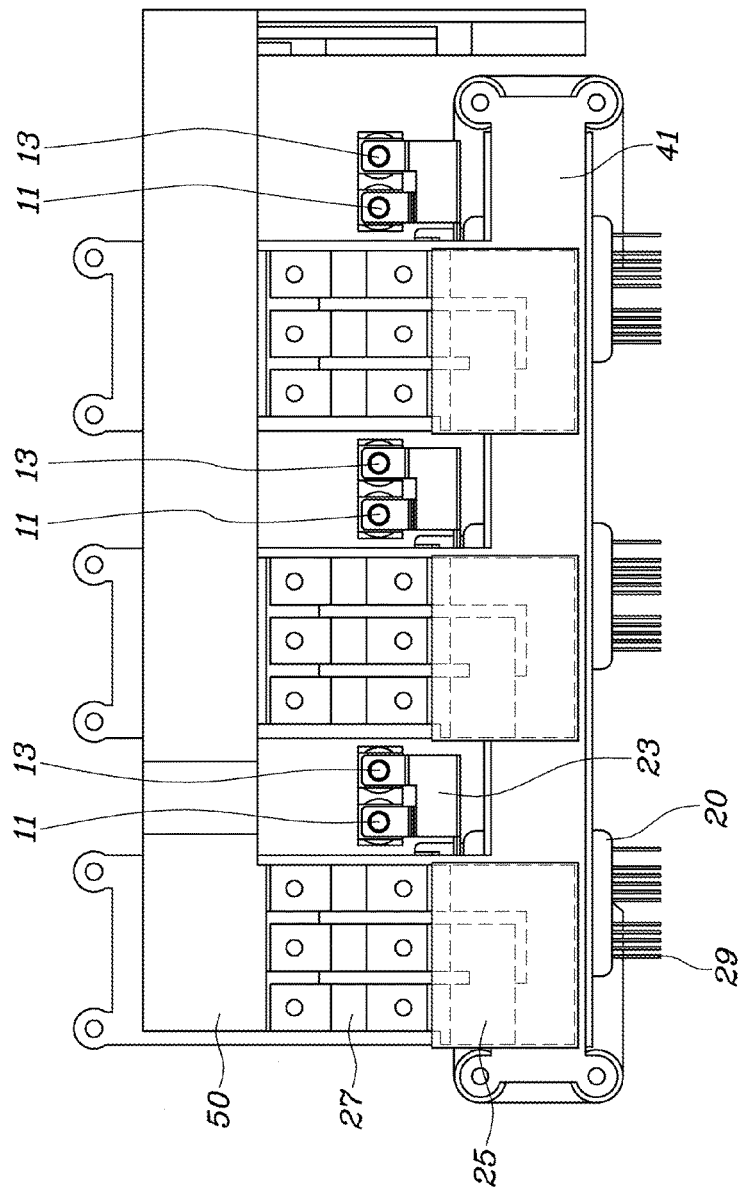
FIG. 7 is a top plan view illustrating an inverter internal structure.

FIG. 7 is a top plan view illustrating an inverter internal structure in one form of the present disclosure. Referring to FIGS. 4, 6 and 7, when the power modules 20 are provided in six rows and three columns, because each AC bus-bar 25 is connected to two power modules 20 and six power modules 20 are provided in one column, the power modules in each column are connected to three AC-bus-bars 25 and three current sensors 27, which are connected in parallel with one another. Thus, the entire power module assembly 40 is connected to a total of nine AC bus-bars 25 and nine current sensors 27, and the alternating current output from three current sensors 27 form one phase of the output bus-bar 50. In this way, the output bus-bars 50 may output three-phase alternating current including U, V and W phases.

When the power modules 20 are provided in four rows and three columns to realize a desired motor output as illustrated in FIG. 5, the power modules 20 in one column may be connected to two AC bus-bars 25 and two current sensors 27, which are connected in parallel with one another. At this time, although the number of constituent elements of the inverter is reduced, there is no variation in the internal configuration of the inverter. In this way, an inverter, which may handle various motor outputs, may be easily realized.

Figure 8:
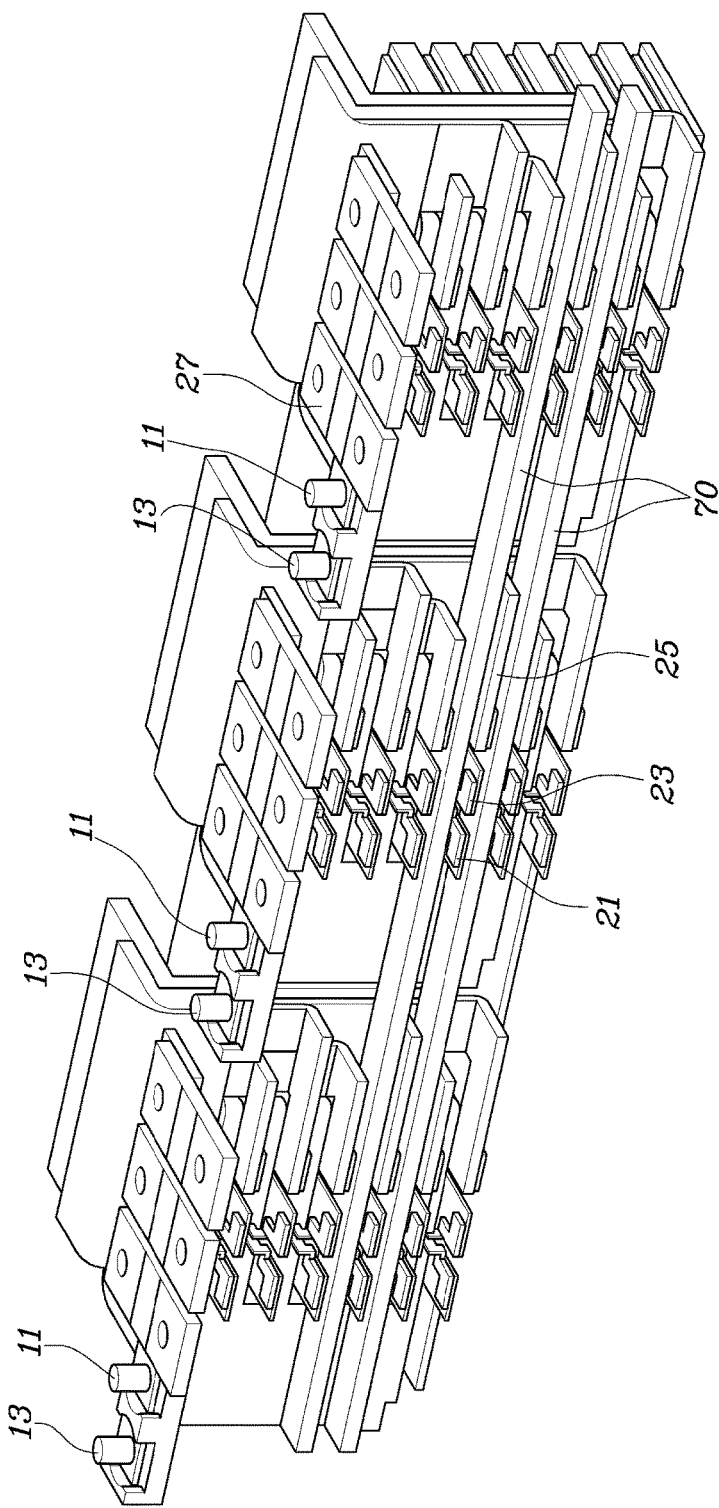
FIG. 8 is a perspective view illustrating the inside of the power module assembly during laser welding.

In the above-described configuration, the DC bus-bars 21 and 23 and the AC bus-bars 25 are secured to the power modules 20 via laser welding. As illustrated in FIG. 8, welding may be performed by applying a laser to a welding interface after jigs 70 are inserted between the power modules 20 so that the DC bus-bars 21 and 23 and the AC bus-bars 25 are pushed by the power modules 20. FIG. 8 is a perspective view illustrating the inside of the power module assembly during laser welding in one form of the present disclosure.

Here, because the jig 70 is horizontally elongated, the power modules 20 in three columns may be welded at the same time when the power modules 20, the DC bus-bars 21 and 23, and the AC bus-bars 25 are laser-welded, which may advantageously simplify the manufacturing process.

Meanwhile, referring to FIGS. 3 and 4, a plurality of pins 29, which is connected to a circuit board 80, may be formed on one side of the power modules 20, and the pins 29 may be fixed by a bracket 90. That is, when the positions of the pins 29 are fixed using the bracket 90, easy assembly of the pins 29 to the circuit board 80 may be achieved.

In addition, the power module assembly 40 may further include an upper surface plate 41, which comes into contact with the upper surface of an uppermost one of the stacked coolers 30, a lower surface plate 43, which comes into contact with the lower surface of a lowermost one of the stacked coolers 30, and fixing pieces 45 for fixing the upper surface plate 41 and the lower surface plate 43 to each other.

That is, when the plural power modules 20 and the plural coolers 30 are stacked one above another between the upper surface plate 41 and the lower surface plate 43, it is possible to inhibit or prevent the power modules 20 and the coolers 30 from deviating from the positions thereof.

In addition, the lower surface plate 43 may be provided with leaf springs, which apply force upward at the positions corresponding to the three columns of the power modules 20. That is, the leaf springs serve to apply surface pressure so that the power modules 20 and the coolers 30 come into close contact with each other.

As is apparent from the above description, according to an inverter structure for a vehicle described above, even when the number of power modules is changed, the inverter may be capable of providing various motor outputs while maintaining a consistent structural shape thereof, which enables a reduction in cost due to common use of parts.

In addition, as a result of alternately stacking power modules and coolers with one another, the volume of the inverter may be reduced.

Although the exemplary forms of the present disclosure have been described above with reference to the accompanying drawings, those skilled in the art will appreciate that the present disclosure can be implemented in various other forms without changing the technical ideas or features thereof.

What is claimed is:

1. An inverter structure for a vehicle, comprising:
   a capacitor configured to receive direct current (DC) supplied from a battery;
   a power module assembly in which power modules of a plurality of power modules are connected to the capacitor to convert the direct current into three-phase alternating current (AC), and coolers of a plurality of coolers are alternately stacked one above another such that each cooler of the plurality of coolers comes into contact at upper and lower surfaces thereof with adjacent power modules of the plurality of power modules for heat transfer therebetween; and an output bus-bar connected to the plurality of power modules and configured to output the three-phase alternating current to a motor, wherein the power module assembly is configured such that the power modules of the plurality of power modules are divided into three columns and are stacked one above another, and the coolers of the plurality of coolers are stacked one above another in a column so as to come into contact with the power modules of the plurality of power modules in a horizontal direction, wherein the power modules of each of the three columns respectively convert direct current supplied from the capacitor into alternating current including U, V and W phases, thereby outputting three-phase alternating current, and wherein a number of the power modules stacked in each of the three columns are changeable to match with various outputs of the motor while the stacked coolers in the column maintain stationary with respect to the changed number of the power modules.

2. The inverter structure according to claim 1, wherein the capacitor includes three pairs of P and N terminals, and wherein each pair of the P and N terminals are connected to the power modules of the plurality of power modules, which are stacked one above another in one column among the three columns of the plurality of power modules, via a DC bus-bar.

3. The inverter structure according to claim 1, wherein the output bus-bar is connected, on an individual phase basis, to at least one power module of the plurality of power modules, which are stacked one above another in one column among the three columns of the plurality of power modules, via an AC bus-bar and a current sensor.

4. The inverter structure according to claim 3, wherein the AC bus-bar is configured to connect two power modules of the plurality of power modules to one end of the current sensor, and wherein the current sensor includes a remaining end connected to the output bus-bar.

5. The inverter structure according to claim 1, wherein a pin is provided on one side of each power module of the plurality of power modules, and the pins provided on the one side of the plurality of power modules are connected to a circuit board, and wherein the pins are fixed by a bracket.

6. The inverter structure according to claim 1, wherein the power module assembly further includes:

an upper surface plate configured to come into contact with an upper surface of an uppermost one of the stacked coolers;

a lower surface plate configured to come into contact with a lower surface of a lowermost one of the stacked coolers; and a fixing piece configured to fix the upper surface plate and the lower surface plate to each other.

7. The inverter structure according to claim 6, wherein a portion of the lower surface plate is curved in an upward direction and configured to apply force upward at a position corresponding to a column disposed farthest from the capacitor among the three columns of the plurality of power modules.

8. The inverter structure according to claim 1, wherein the power module assembly is provided in one side of a housing, wherein the capacitor is provided in a lower region of an opposite side of the housing, and wherein the output bus-bar has one end provided in an upper region of the opposite side of the housing and a remaining end protruding outward from the housing.

* * * * *